United States Patent
Lee et al.

(10) Patent No.: US 7,400,211 B2
(45) Date of Patent: Jul. 15, 2008

(54) HIGH SPEED PASSBAND PHASE MODULATION APPARATUS AND METHOD OF THE SAME

(75) Inventors: Jae Sup Lee, Yongin-si (KR); Tae Wook Kim, Nonsan-si (KR); Seung Woo Kim, Yongin-si (KR); Jeong Hoon Lee, Pohang-si (KR); Young Sik Kim, Pohang-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 211 days.

(21) Appl. No.: 11/471,512

(22) Filed: Jun. 21, 2006

(65) Prior Publication Data

US 2007/0152767 A1 Jul. 5, 2007

(30) Foreign Application Priority Data

Jan. 4, 2006 (KR) ............ 10-2006-0000751

(51) Int. Cl.
*H03C 3/08* (2006.01)

(52) U.S. Cl. .......... 332/144; 327/161; 327/234; 327/244

(58) Field of Classification Search .......... 332/144; 327/161, 234, 244
See application file for complete search history.

(56) References Cited

U.S. PATENT DOCUMENTS 7,319,352 B2 * 1/2008 Scheytt ............ 327/161

* cited by examiner

*Primary Examiner*—Robert J. Pascal
*Assistant Examiner*—James E Goodley
(74) *Attorney, Agent, or Firm*—Sughrue Mion, PLLC

(57) ABSTRACT

A high speed passband phase modulation apparatus and method are provided. In the phase modulation apparatus, an RF phase shifter modulates a phase of a local signal that is generated in a VCO according to a digital input. The RF phase shifter is controlled by a phase-controlled loop so that a baseband phase shifter is phased locked to a modulation reference signal from the local signal and a reference clock signal according to the digital input. The phase-controlled loop phase-locks using the modulation reference signal so that the phase-modulated signal generated in the RF phase shifter has a phase value according to the digital input.

25 Claims, 9 Drawing Sheets

HIGH SPEED PASSBAND PHASE MODULATION APPARATUS AND METHOD OF THE SAME

CROSS-REFERENCE TO RELATED APPLICATION

This application claims the benefit of Korean Patent Application No. 10-2006-0000751, filed on Jan. 4, 2006, in the Korean Intellectual Property Office, the entire disclosure of which is incorporated herein by reference.

BACKGROUND OF THE INVENTION

1. Field of the Invention

The present invention relates to a phase modulator of a radio frequency (RF) transmitter and, more particularly, to a high speed phase modulator employing a polar modulation scheme for multi-band processing and a method of the same.

2. Description of Related Art

A superheterodyne or a polar modulation scheme may be utilized as a transmission method in a system for transmitting/receiving high speed wireless data, such as, for example, a mobile phone, a digital multimedia broadcasting (DMB) phone and a personal digital assistant (PDA).

FIG. 1 is a diagram illustrating a transmitter 100 employing a superheterodyne scheme according to a conventional art. Referring to FIG. 1, the transmitter 100 includes an intermediate frequency processing unit 110, a carrier processing unit 120, a surface acoustic wave (SAW) filter 130 and a power amplifier 140. In this system, the phase-modulated I and Q signals in the baseband are up-converted to an intermediate frequency band in the intermediate frequency processing unit 110. Then, the output of the intermediate frequency processing unit 110 is up-converted to a frequency band of the carrier signal in the carrier filter 120. When the baseband signal is being processed in the intermediate frequency processing unit 110 and the carrier processing unit 120, an image tone, analogous to noise, may be generated. When this occurs, the generated image tone is removed in the SAW filter 130. The signal output from the SAW filter 130 is amplified by the power amplifier 140 to an appropriate power level.

However, the conventional transmitter 100 employing a superheterodyne scheme as described above requires the SAW filter 130 in order to remove the image tone. Therefore, because the power amplifier 140 has to cover the resulting changes in linearity for a modulation scheme such as, for example, quadrature phase shift keying (QPSK) and binary phase shift keying (BPSK), the transmitter 100 is not suitable for multi-band processing.

In contrast, a polar modulation scheme is suitable for multi-band processing in an ubiquitous system that can up-convert a baseband signal in a Code Division Multiple Access (CDMA) system, a global positioning system (GPS), a personal communication system (PCS), an International Mobile Telecommunication (IMT) 2000 system, Wireless Broadband Internet (WiBro) system, a wireless local area network (WLAN), an Ultra Wideband (UWB) system and a WiMax system.

FIG. 2 is a diagram illustrating a transmitter 200 employing a polar modulation scheme according to a conventional art. Referring to FIG. 2, the transmitter 200 includes a phase-locked loop (PLL) 210, a voltage-controlled oscillator (VCO) 220, a power amplifier 230, a modulation unit 240 and a controller 250. In the polar modulation scheme described above, the operation of the PLL 210 and the modulation unit 240 is in accordance with baseband signals I and Q. The PLL 210 and the modulating unit 240 control the phase of the passband signal that is output from the VCO 220. Also, as the phase is shifted, the power level of the signal is appropriately amplified before and after the phase shift by the controller 250.

However, the conventional transmitter 200 employing a polar modulation scheme as described above shifts the phase of the VCO 220 using the PLL 210. Accordingly, a loop filter (not shown) that is provided in the PLL 210 needs a fast response time in order to provide a fast phase shift. However, high speed phase modulation is difficult to achieve because of loop bandwidth limitations. Also, in the polar modulation scheme that directly controls the VCO 220 in order to shift the phase, a momentary frequency change is unavoidable at the instant of the phase shift. In this case, it may not be possible to design a power amplifier that has a sufficiently wide bandwidth corresponding to the frequency change.

SUMMARY OF THE INVENTION

The present invention provides a high speed phase modulation that covers a broad bandwidth by using a phase modulator of a polar modulation scheme that phase-modulates a passband signal after a voltage-controlled oscillator.

The present invention also provides a phase modulation method which is applicable to various types of phase modulation schemes and is suitable for multi-band processing.

According to an aspect of the present invention, a phase modulator for a polar modulation system includes an RF phase shifter that phase-shifts a local signal based on a digital input and phase-adjusts the phase-shifted signal according to a control voltage. The RF phase shifter also generates a phase-modulated signal having a phase value corresponding to the digital input. The phase modulator also includes a baseband phase shifter that phase-adjusts a reference clock signal by a phase value corresponding to the digital input based on the local signal and generates a modulation reference signal. In addition, the phase modulator includes a phase control loop that generates the control voltage from the modulation reference signal and a feedback signal corresponding to the phase-modulated signal, and the phase control loop phase-locks the phase-modulated signal to the modulation reference signal.

Preferably, but not necessarily, the local signal is an oscillation signal phase-locked to the reference clock signal, and the local signal has a higher frequency than the reference clock signal. In addition, the reference clock signal may be, for example, a baseband signal generated from a crystal oscillator.

According to another aspect of the present invention, the RF phase shifter includes a digitally-controlled phase shifter that includes a first set of R-C filters, each R-C filter having a resistor and a varactor/switched-capacitor array for each of the differential signals of the local signal in order to receive the differential signals. The digitally-controlled phase shifter changes capacitance of the respective varactor/switched-capacitor array according to the digital input and phase-shifts each of the differential signals of the local signal. The RF phase shifter also includes a voltage-controlled phase shifter that includes a second set of R-C filters, each R-C filter having a resistor and a varactor for each of the phase-shifted differential signals in order to receive the phase-shifted differential signals from the digital-controlled phase shifter. The voltage-controlled phase shifter changes capacitance of the respective varactor based on the control voltage, phase-adjusts each of the phase-shifted differential signals and generates differential signals of the phase-modulated signal.

According to still another aspect of the present invention, the RF phase shifter includes a digitally-controlled phase shifter having a capacitor and a varactor/switched-capacitor array respectively connected to each side of a first coil of a first transformer and a capacitor and a varactor/switched-capacitor array respectively connected to each side of a second coil of the first transformer. The digitally-controlled phase shifter phase-shifts the local signal by receiving the local signal via the capacitor connected to the first coil of the first transformer and changing capacitance of the varactor/switched-capacitor arrays of the first transformer based on the digital input. The phase-shifted signal is output via the capacitor connected to the second coil of the first transformer. The RF phase shifter also includes a voltage-controlled phase shifter having a capacitor and a varactor respectively connected to each side of a first coil of a second transformer and a capacitor and a varactor respectively connected to each side of a second coil of the second transformer. The voltage-controlled phase shifter phase-adjusts the phase-shifted signal received from the digitally-controlled phase shifter via the capacitor connected to the first coil of the second transformer and thereby generates the phase-modulated signal. The phase-modulated signal is generated by changing capacitance of the varactors of the second transformer based on the control voltage, and the phase-modulated signal is output via the capacitor connected to the second coil of the second transformer.

According to yet another aspect of the present invention, the phase modulator includes a multiplexer that selects, based on a selection signal, one of a plurality of oscillation signals, for example, four oscillation signals, each oscillation signal having a phase that is different from the other oscillation signals. The selected oscillation signal is output as the local signal. The phase modulator also includes a decoder that decodes the digital input to generate the selection signal. The generation of the selection signal is such that an oscillation signal with a phase closest to a target phase value, which is based on the digital input, is selected from the plurality of oscillation signals. This configuration reduces the burdens of phase adjustment for the RF phase shifter, which phase-shifts the selected local signal in the multiplexer.

According to another aspect of the present invention, there is provided a phase modulation method that includes phase-shifting a local signal according to a digital input, phase-adjusting the phase-shifted signal according to a control voltage and generating a phase-modulated signal having a phase value according to the digital input. The method may also include phase-adjusting a reference clock signal by a phase value that corresponds to the digital input based on the local signal and generating a modulation reference signal. Consistent with the present invention, the method may generate the control voltage from the modulation reference signal and a feedback signal corresponding to the phase-modulated signal, and phase-lock the phase-modulated signal to the modulation reference signal.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF ILLUSTRATIVE, NON-LIMITING EMBODIMENTS OF THE INVENTION

Figure 1:
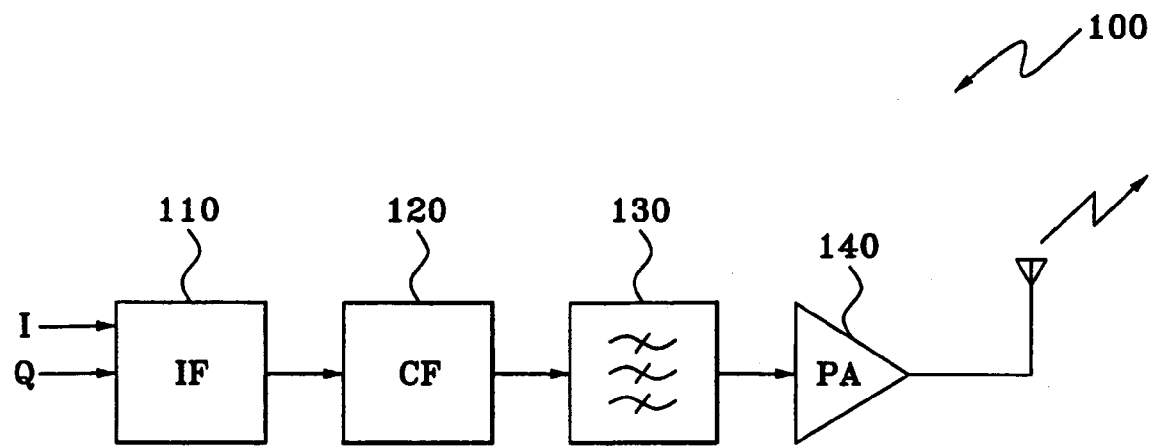
FIG. 1 is a diagram illustrating a transmitter employing a superheterodyne system according to a conventional art.
Figure 2:
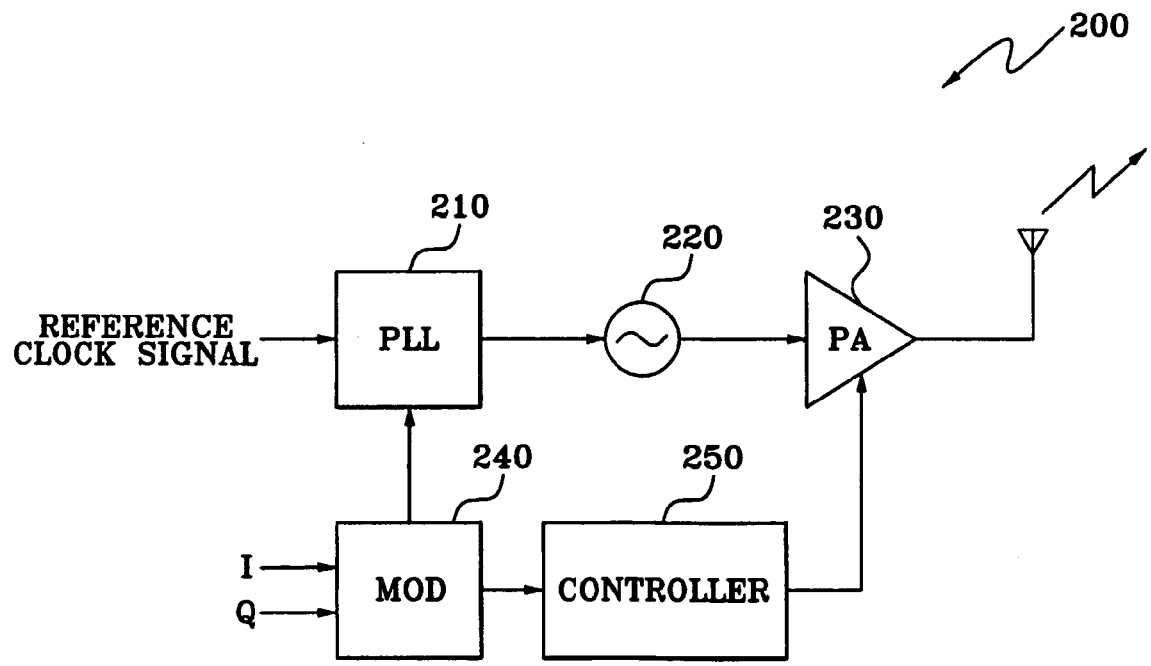
FIG. 2 is a diagram illustrating a transmitter employing a polar modulation system according to a conventional art.

Reference will now be made in detail to illustrative, non-limiting embodiments of the present invention, examples of which are illustrated in the accompanying drawings, wherein like reference numerals refer to the like elements throughout. The embodiments are described below in order to explain the present invention by referring to the figures.

Figure 3:
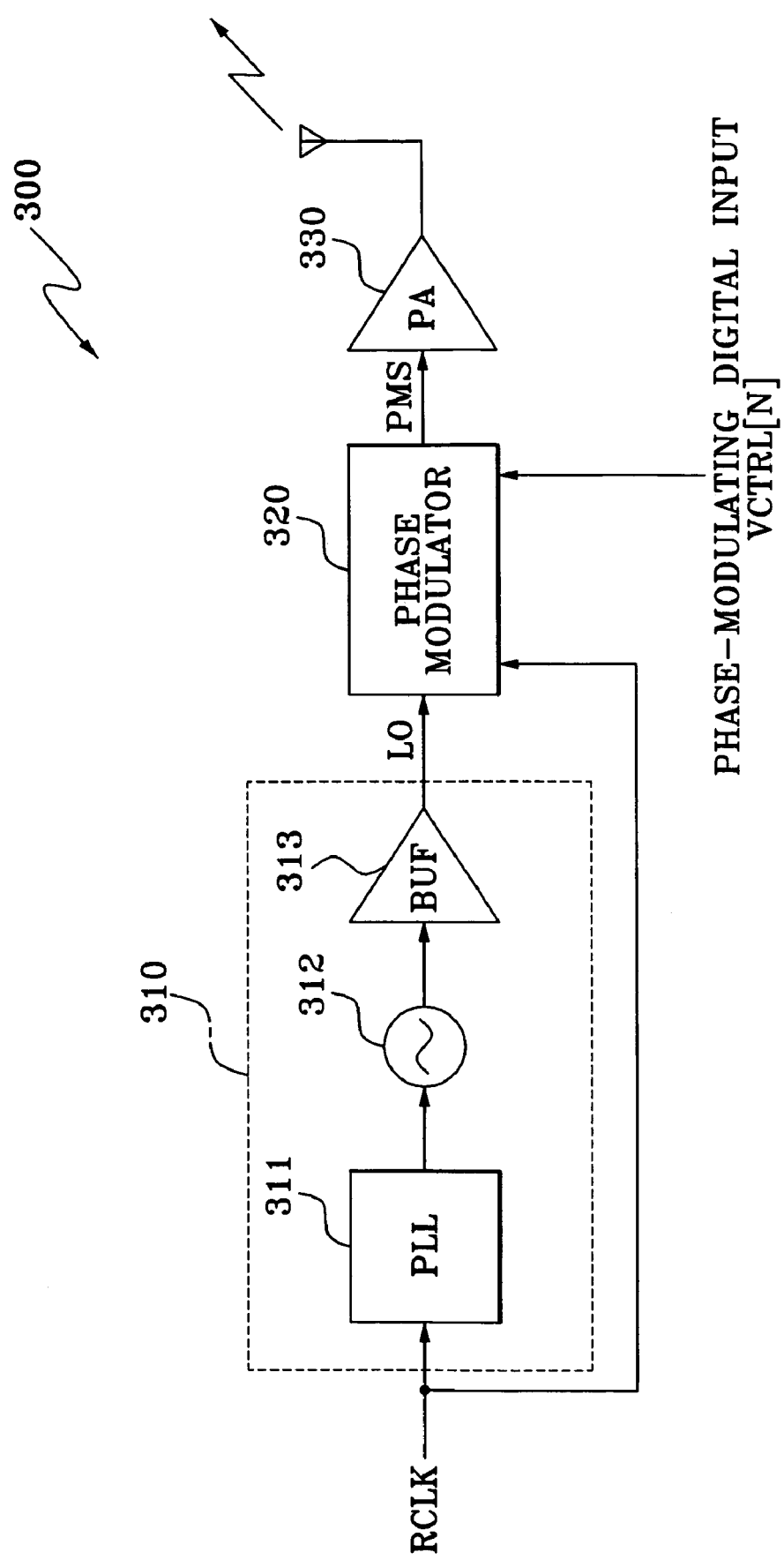
FIG. 3 is a diagram illustrating a transmitter employing a polar modulation system according to an embodiment of the present invention.

FIG. 3 is a diagram illustrating a transmitter 300 employing a polar modulation scheme according to an embodiment of the present invention. Referring to FIG. 3, the transmitter 300 includes a local signal generation unit 310, a phase modulator 320 and a power amplifier 330.

The local signal generation unit 310 generates a local signal LO that is phase-locked to a reference clock signal RCLK by using a phase-locked loop (PLL) 311. The signal for controlling phase-locking may be generated by the PLL 311. A voltage-controlled oscillator (VCO) 312 may generate a local oscillation signal that has a higher frequency than the reference clock signal RCLK. An oscillation signal generated in the VCO 312 may be initially buffered in a buffer 313 and subsequently output as the local signal LO. In this exemplary embodiment, the reference clock signal RCLK is a clock signal which is generated from a crystal oscillator and is in a stable and clean baseband. The local signal LO has a higher radio frequency than the reference clock signal RCLK, which may be, for example, a certain carrier frequency, and the local signal LO is generated from the local signal generation unit 310.

In the present invention, the transmitter 300 employs a polar modulation system which is suitable for multi-band processing in a ubiquitous system that is applicable to any type of system such as, for example, a CDMA system, a GPS, a PCS, an IMT2000 system, a WiBro system, WLAN, a UWB system and a WiMax system. In the transmitter 300, the phase of the local signal LO that has a passband may be modulated at a high speed after the VCO 312. That is, the phase modulator 320 generates a phase-modulated signal PMS by phase-modulating the local signal LO, which is generated in the local signal generation unit 310, by a corresponding phase value based on a phase-modulated digital input VCTRL[N]. In this case, the reference clock signal RCLK in the stable baseband is utilized as the reference signal so that the phase-modulated signal PMS generated in the phase modulator 320 is phase-locked.

Unlike the conventional art, the transmitter 300 according to the present invention having the characteristics described above does not control the VCO 312 directly or with a feedback. Accordingly, even when shifting a phase, the frequency of the local signal LO or the phase-modulated signal PMS may be rarely changed. The phase-modulated signal PMS may be quickly generated while shifting the phase at a high speed.

Also, the phase-modulated signal PMS from the phase modulator 320 may be amplified in the power amplifier 330 to have an appropriate power level and then transmitted via an antenna. In particular, since the phase-modulated signal PMS may be generated to have a constant envelope, a saturated amplifier may be utilized as the power amplifier 330 without regard to the modulation scheme such as, for example, QPSK and BPSK.

Figure 4:
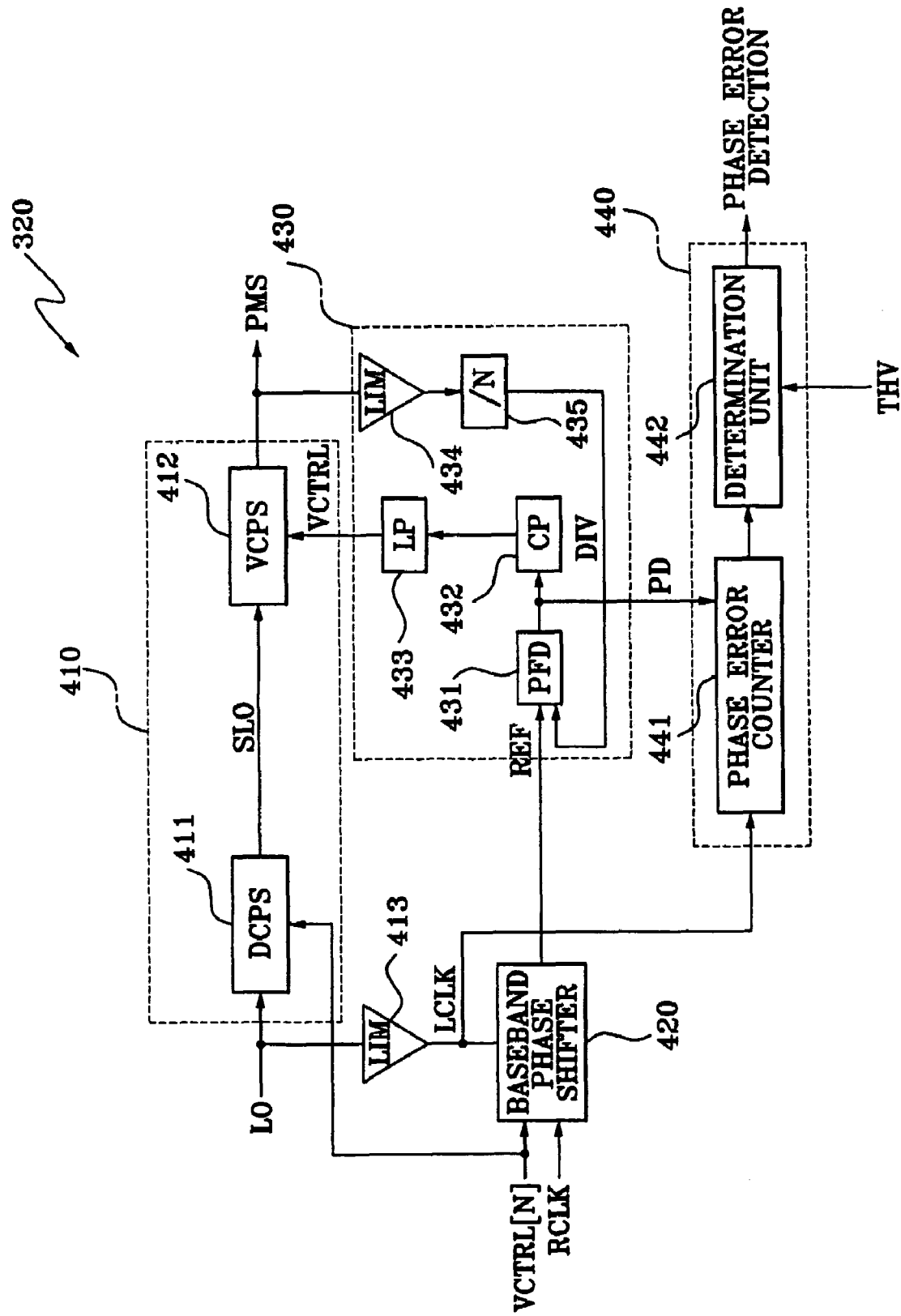
FIG. 4 is a diagram illustrating a phase modulator according to an embodiment of the present invention.

FIG. 4 is a block diagram illustrating the phase modulator 320 of FIG. 3 according to an embodiment of the present invention. Referring to FIG. 4, the phase modulator 320 includes an RF phase shifter 410, a limiter 413, a baseband phase shifter 420, a phase-controlled loop 430 and a phase error detection unit 440.

In this exemplary embodiment, the RF phase shifter 410 includes a digitally-controlled phase shifter (DCPS) 411 and a voltage-controlled phase shifter (VCPS) 412. The DCPS 411 generates a phase-shifted signal SLO by phase-shifting the local signal LO to be nearer the target phase value based on digital input VCTRL[N]. The phase-shifted signal SLO from the DCPS 411 is precisely phase-adjusted in the VCPS 412 based on the control voltage VCTRL from the phase-controlled loop 430. With this configuration, the phase-modulated signal PMS that has a phase value according to the digital input VCTRL[N] is generated in the VCPS 412.

Figure 10:
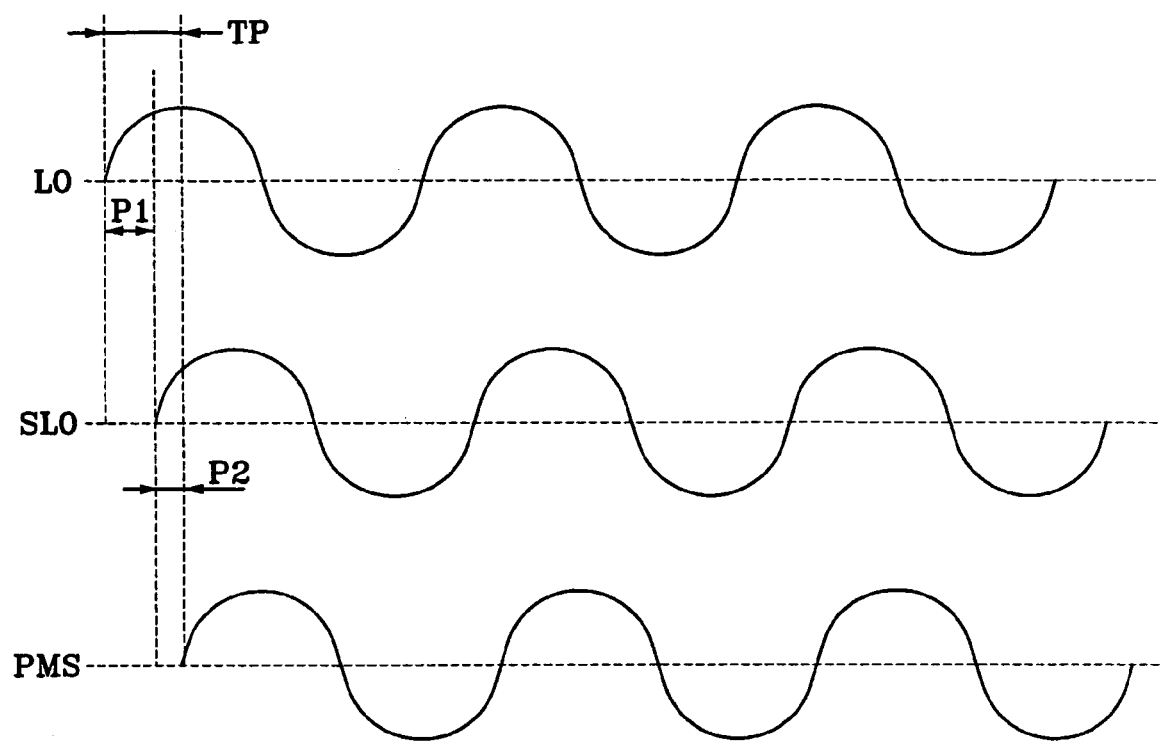
FIG. 10 is a diagram illustrating a phase relationship among signals LO, SLO and PMS to explain an operation of the phase modulator shown in FIG. 4.

As an example, as shown in FIG. 10, when a target phase value TP according to the digital input VCTRL[N] is 90 degrees, the DCPS 411 may generate the phase-shifted signal SLO, which has a phase that is shifted to be nearer the target phase value TP, that is, nearer by P1. Further, the VCPS 412 may precisely phase-adjust the phase-shifted signal SLO by P2 and generate the phase-modulated signal PMS.

The DCPS 411 and the VCPS 412 may utilize an R-C filter that has a resistor and a varactor/switched-capacitor array, and change a capacitance of the varactor or the switched-capacitor array based on the digital input VCTRL[N] or the control voltage VCTRL to adjust a phase of an input signal. The adjustment will be described below with reference to FIGS. 5 through 8. Also, the DCPS 411 and the VCPS 412 may utilize capacitors and varactor/switched-capacitor arrays that are connected to first and second coils of transformers as described below, and change the capacitance of the varactor or the switched-capacitor array based on the digital input VCTRL[N] or the control voltage VCTRL to adjust the phase of an input signal.

The limiter 413 receives the local signal LO and compares it with a threshold level. Also, the limiter 413 generates a clock signal LCLK that is buffered to be a high/low logical signal, for example, a square wave.

Figure 11:
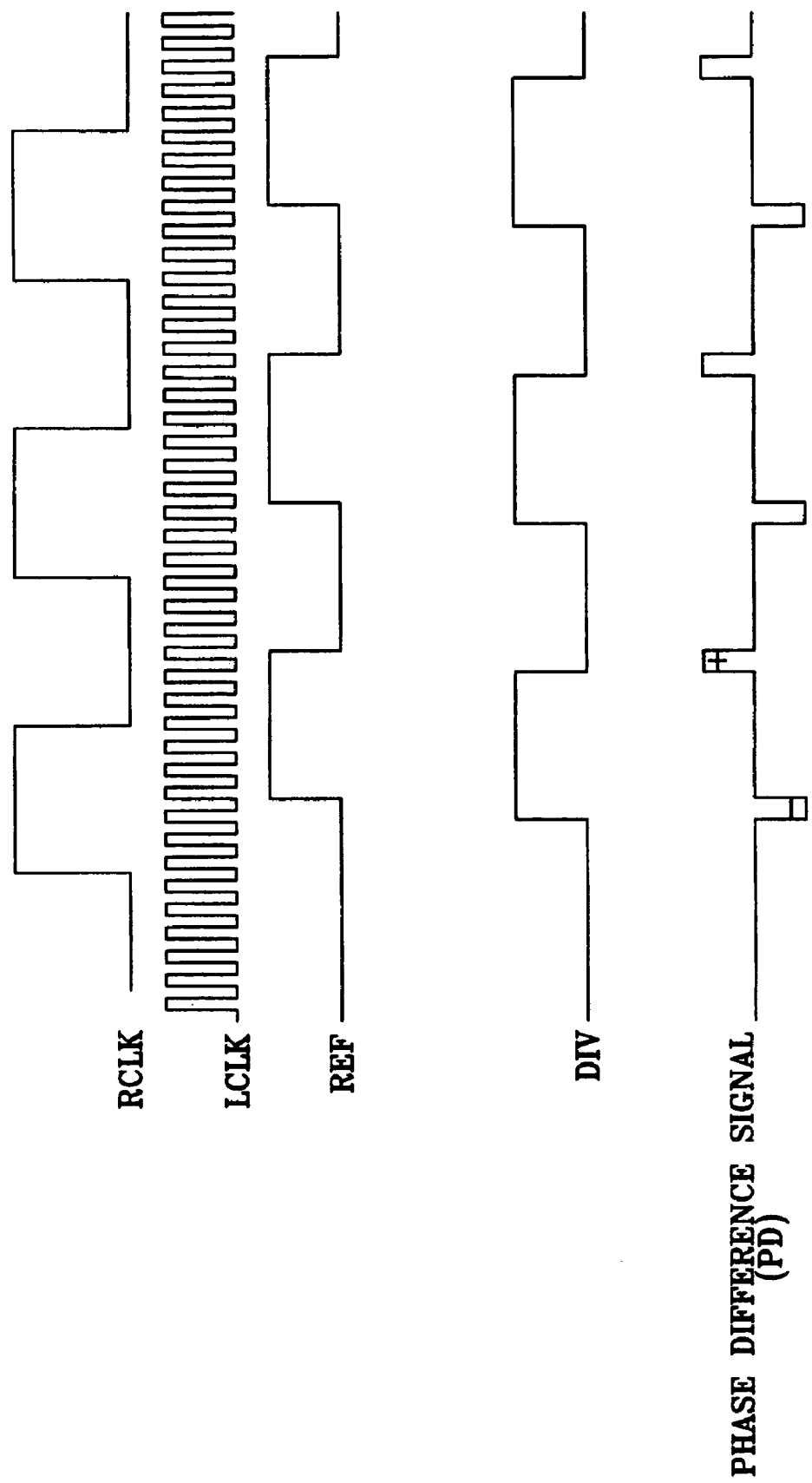
FIG. 11 is a diagram illustrating a phase relationship among signals RCLK, LCLK, REF and DIV to explain an operation of the phase modulator shown in FIG. 4.

As illustrated in FIG. 11, the baseband phase shifter 420 phase-shifts the reference clock signal RCLK by a phase value corresponding to the digital input VCTRL[N] and generates a modulation reference signal REF by utilizing the clock signal LCLK from the limiter 413. For example, the number of pulses of the clock signal LCLK from the limiter 413 may be counted by a certain counter to represent a phase value corresponding to the digital input VCTRL[N], for example, 0, 90, 180 and 270 degrees. The reference clock signal RCLK may be phase-adjusted by the counted value. The modulation reference signal REF that is generated as described above is inputted into the phase-controlled loop 430. In addition, a feedback signal corresponding to the phase-modulated signal PMS that is generated in the RF phase shifter 410 is also inputted into the phase-controlled loop 430.

The phase-controlled loop 430 generates the control voltage VCTRL based on the modulation reference signal REF and the feedback signal corresponding to the phase-modulated signal PMS. The control voltage VCTRL is then sent to the RF phase shifter 410 to phase-lock the phase-modulated signal PMS to the modulation reference signal REF.

As illustrated in FIG. 4, the phase-controlled loop 430 utilizes a phase/frequency detector 431, a charge pump 432, a loop filter 433, a limiter 434 and a frequency divider 435. The phase-controlled loop 430 compares the feedback signal corresponding to the phase-modulated signal PMS and the modulation reference signal REF, and generates the control voltage VCTRL based on the comparison result. The limiter 434 receives the feedback signal and compares it to a threshold level. The limiter 434 then generates an output signal that is buffered to a high/low logic signal, e.g., a square wave. The frequency divider 435 frequency-divides the output of the limiter 434. The frequency-divided signal DIV from the frequency divider 435 may have a frequency that is similar to the modulation reference signal REF. The phase/frequency detector 431 compares the phase of the frequency-divided signal DIV and the phase of the modulation reference signal REF and generates a phase difference signal PD (refer to FIG. 11). Preferably, but not necessarily, the phase-controlled loop 430 may be designed as a digital circuit, and the phase difference signal PD may be generated as a digital value. FIG. 11 conceptually illustrates the phase difference signal PD. In this example, signals that indicate a positive value +, i.e., an up signal, and a negative value −, i.e., a down signal, may be separately generated in the phase difference signal PD.

The charge pump 432 adjusts an amount of output charge based on the phase difference signal PD. When the phase difference signal PD is separately outputted as an up signal or a down signal, the amount of output charge from the charge pump 432 may be increased or decreased, respectively. The loop filter 433 then generates a voltage, which corresponds to the control voltage VCTRL, based on the output charge of the charge pump 432.

The phase modulator 320 according to the present embodiment may include a phase error detection unit 440. The phase error detection unit 440 includes a phase error counter 441 and a determination unit 442. The phase error detection unit 440 may detect a phase error of the phase-modulated signal PMS that is being currently outputted by using the output LCLK of the limiter 413 and the phase difference signal PD. For example, the phase error counter 441 may count the number of pulses of the output LCLK of the limiter 413 for a phase duration corresponding to the phase difference signal PD. The determination unit 442 may generate a flag signal that indicates whether the counted value in the phase error counter 441 is more or less than a threshold THV. For example, when the counted value is more than the threshold THV indicating, for example, a phase of 20 degrees, the flag signal may be set to a logical high. Otherwise, the flag signal may be set to a logical low.

Figure 5:
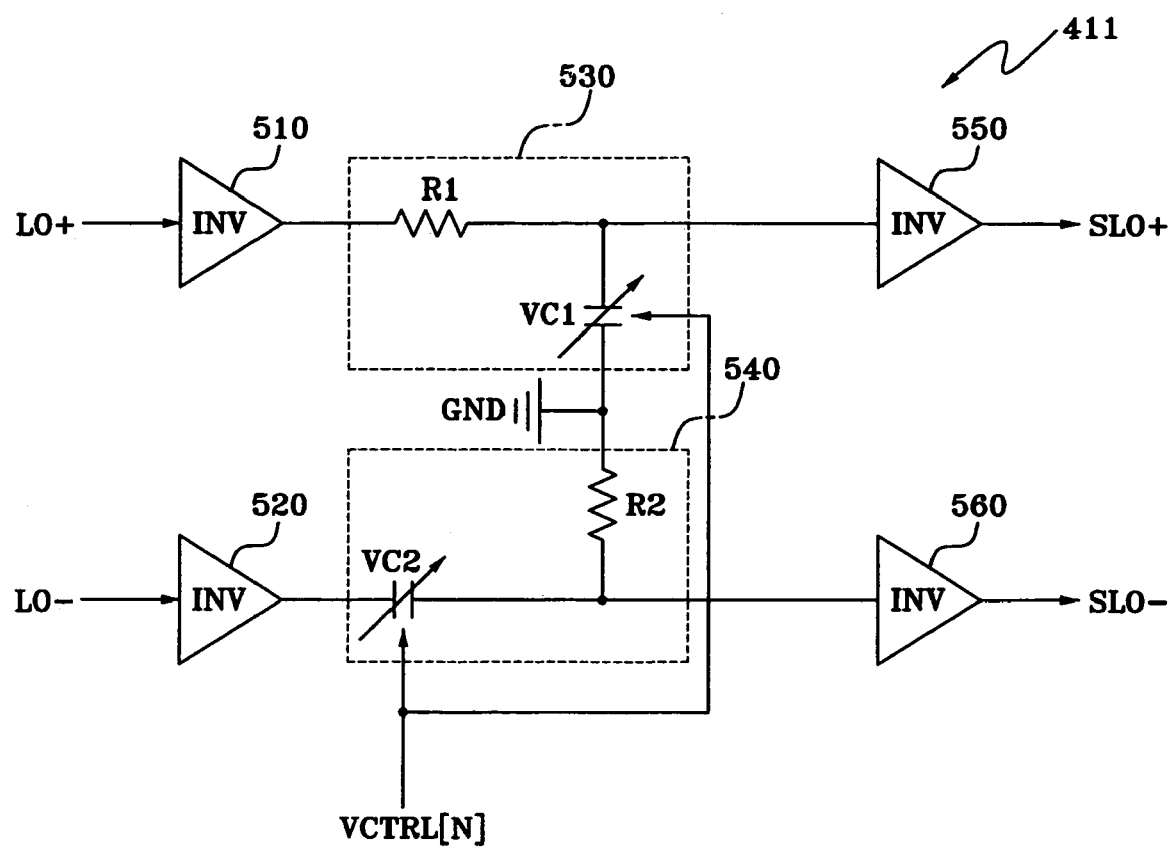
FIG. 5 is a diagram illustrating an example of a digital-controlled phase shifter shown in FIG. 4 according to an embodiment of the present invention.
Figure 6:
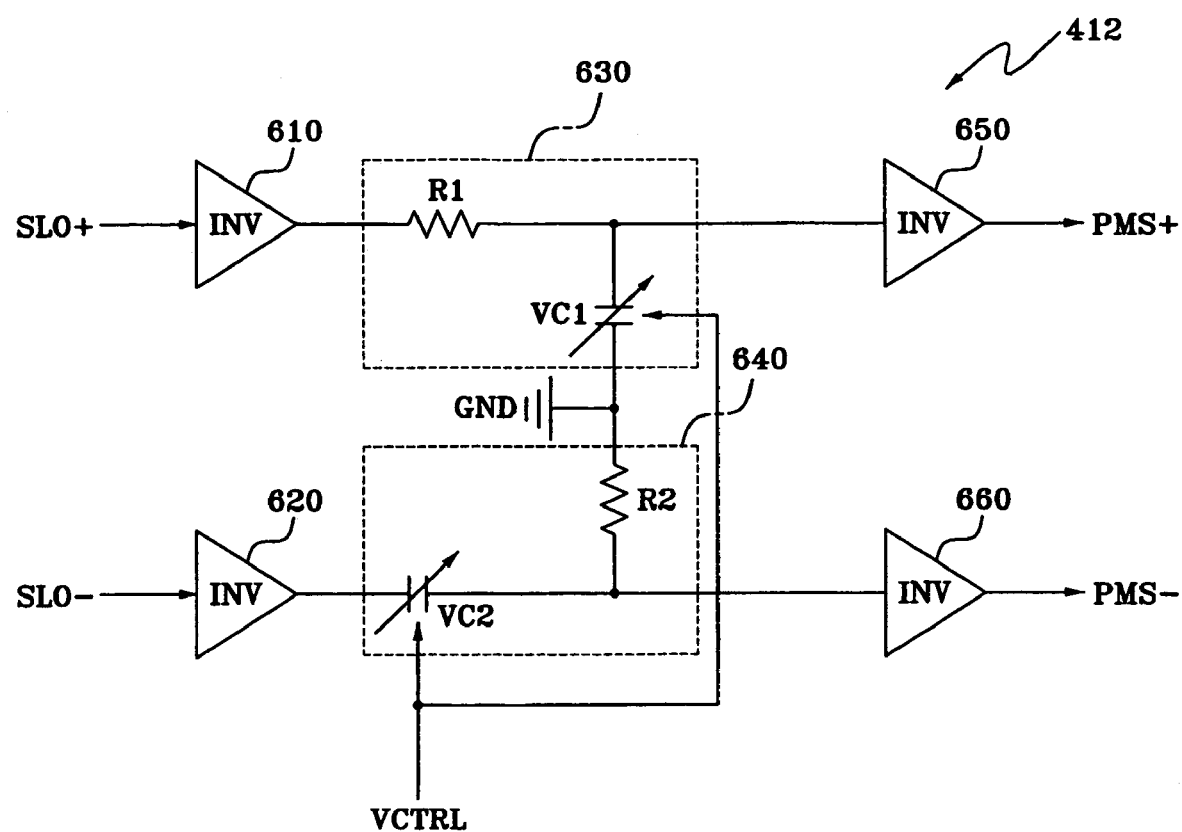
FIG. 6 is a diagram illustrating an example of a voltage-controlled phase shifter shown in FIG. 4 according to an embodiment of the present invention.

FIG. 5 illustrates an example of a circuit of the DCPS 411 shown in FIG. 4. FIG. 6 illustrates an example of a circuit of the VCPS 412 shown in FIG. 4 and has a similar configuration to the DCPS 411.

The DCPS 411 includes four buffers 510, 520, 550 and 560, which are in the form of inverters, an R-C low pass filter (LPF) 530 and an R-C high pass filter (HPF) 540. In this exemplary embodiment, the R-C LPF 530 includes a resistor R1 and a array VC1, and the R-C HPF 540 includes a resistor R2 and an array VC2. The array VC1 and the array VC2 may include a plurality of varactors or a plurality of switched-capacitors. The resistors R1 and R2 may be substantially identical in resistance so that phase-shifted differential signals SLO+ and SLO− are outputted symmetrically with a 180 degree phase difference through the operation of the R-C LPF 530 and the R-C HPF 540. Preferably, but not necessarily, the arrays VC1 and VC2 may include symmetrical varactor/switched-capacitors so that capacitance value changes are identical.

In FIG. 6, the VCPS 412 includes four buffers 610, 620, 650 and 660, which are in the form of inverters, an R-C LPF 630 and an R-C HPF 640. In this exemplary embodiment, the R-C LPF 630 includes a resistor R1 and a varactor VC1 and the R-C HPF 640 includes a resistor R2 and a varactor VC2. The VCPS 412 has a configuration similar to that of the DCPS 411, which is described above.

However, while the capacitance of the arrays VC1 and VC2 in the R-C LPF 530 and the R-C HPF 540, respectively, of the DCPS 411 is changed based on the digital input VCTRL[N], capacitance of the varactors VC1 and VC2 in the R-C LPF 630 and the R-C HPF 640, respectively, is changed based on the control voltage VCTRL to precisely adjust the phase of the phase-modulated signal PMS. The control voltage VCTRL is generated in the phase-controlled loop 430 (FIG. 5).

As shown in FIG. 5, the DCPS 411 utilizes the R-C LPF 530 and the R-C HPF 540 having resistors R1 and R2, respectively, and arrays VC1 and VC2, respectively, to receive differential signals LO+ and LO−, respectively, of the local signal LO after passing through buffers 510 and 520, respectively. In this example, capacitance may be changed by applying a different voltage to the varactor of the arrays VC1/VC2 based on the digital input VCTRL[N], or by selecting a number of switched-capacitors of the arrays VC1/VC2. The differential signals SLO+ and SLO−, which are the phase-shifted signals of the differential signals LO+ and LO−, respectively, of the local signal LO, may be output through the buffers 550 and 560, respectively. In this example, the buffers 510 and 520 may be utilized so that zero-crossing information, for example, a voltage of 0 volts, of the differential signals LO+ and LO− can be easily detected. Also, when the differential signals LO+ and LO− of the local signal LO oscillate between appropriate voltages, for example, 0 to 3 volts peak to peak, the buffers 510 and 520 need not be utilized. Optionally, the buffers 510 and 520 may be utilized to remove noise from signals transmitted to filters 530 and 540 and to ensure the signals have an oscillation between appropriate voltages.

As shown in FIG. 6, the VCPS 412 utilizes the R-C LPF 630 and the R-C HPF 640 having resistors R1 and R2, respectively, and varactors VC1 and VC2, respectively, to receive the phase-shifted differential signals SLO+ and SLO−, respectively, from the DCPS 411. In this exemplary embodiment, when a voltage applied to the varactors VC1/VC2 is varied, capacitance may be changed based on the control voltage VCTRL. Also, each of the phase-shifted differential signals SLO+ and SLO− is precisely phase-adjusted and the phase-modulated differential signals PMS+ and PMS− are finally outputted through buffers 650 and 660, respectively. The buffers 610, 620, 650 and 660 may be optional.

Figure 7:
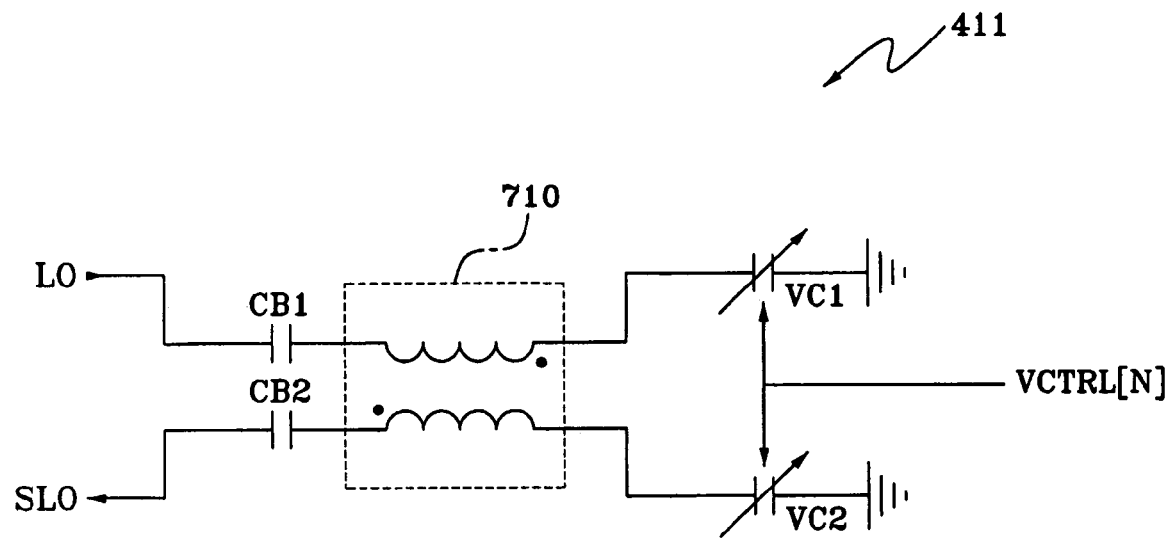
FIG. 7 is a diagram illustrating another example of a digital-controlled phase shifter shown in FIG. 4 according to an embodiment of the present invention.
Figure 8:
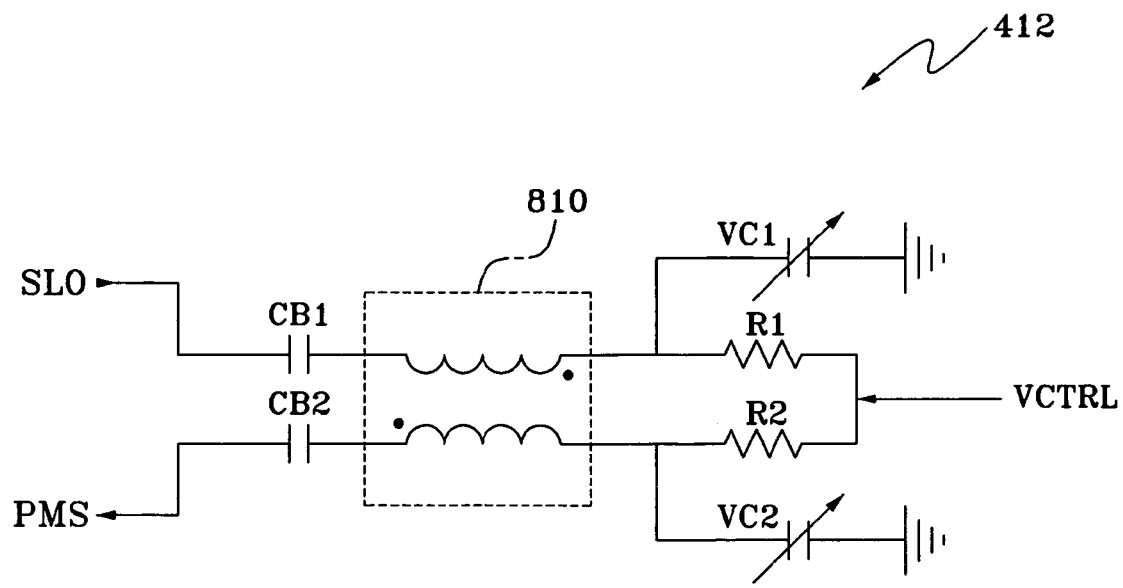
FIG. 8 is a diagram illustrating another example of a voltage-controlled phase shifter shown in FIG. 4 according to an embodiment of the present invention.

FIG. 7 illustrates another exemplary embodiment of a circuit of the DCPS 411 shown in FIG. 4. FIG. 8 illustrates another exemplary embodiment of a circuit of the VCPS 412 shown in FIG. 4 and has a similar configuration to the DCPS 411. In FIGS. 7 and 8, a phase may be modulated at a high speed even in a system which covers a broadband frequency in a multi-band by utilizing transformers 710 and 810.

In FIG. 7, the DCPS 411 includes fixed capacitors CB1 and CB2, a transformer 710 and first and second varactor/switched-capacitor arrays VC1 and VC2. The first and second varactor/switched-capacitor arrays VC1 and VC2 may be constructed as symmetrical varactors/switched-capacitors so that capacitance can vary identically.

Also, in FIG. 8, the VCPS 412 includes fixed capacitors CB1 and CB2, a transformer 810, a first varactor VC1, a second varactor VC2 and resistors R1 and R2. The VCPS 412 has a configuration that is similar to that of the DCPS 411.

However, the VCPS 412 includes the resistors R1 and R2 so that the control voltage VCTRL may be appropriately transmitted from the phase-controlled loop 430 to the first and the second varactors VC1 and VC2. In addition, while capacitance of the first and second varactor/switched-capacitor arrays VC1 and VC2 of the DCPS 411 is changed based on the digital input VCTRL[N], capacitance of the varactors VC1 and VC2 included in the VCPS 412 is changed according to the control voltage VCTRL to precisely adjust a phase.

As shown in FIG. 7, the DCPS 411 utilizes the capacitors CB1 and CB2 and the varactor/switched-capacitor arrays VC1 and VC2. The capacitor CB1 and varactor/switched-capacitor array VC1 are connected to respective ends of the first coil of transformer 710, and the capacitor CB2 and varactor/switched-capacitor array VC2 are connected to respective corresponding ends of the second coil of transformer 710. This configuration phase-shifts the local signal LO, not a differential signal. In this example, capacitance may be changed by applying a different voltage to a varactor of the arrays VC1/VC2 based on the digital input VCTRL[N] or by selecting a number of switched-capacitors of the arrays VC1/VC2. A phase-shifted signal SLO is outputted from the capacitor CB2 that is connected to the second coil of the transformer 710.

As shown in FIG. 8, the VCPS 412 utilizes the capacitors CB1 and CB2 and the varactors VC1 and VC2. The capacitor CB1 and varactor VC1 are connected to respective ends of the first coil of transformer 810, and the capacitor CB2 and varactor VC2 are connected to respective corresponding ends of the second coil of transformer 810. This configuration phase-shifts the phase-shifted signal SLO from the DCPS 411. In this example, when a voltage applied to the varactors VC1/VC2 by the control voltage VCTRL that is inputted via the resistor R1/R2 is varied, capacitance may be changed based on the control voltage VCTRL. Thus, the phase-shifted signal SLO is precisely phase-adjusted and the phase-modulated differential signal PMS may be outputted through the capacitor CB2 that is connected to the second coil of the transformer 810.

Figure 9:
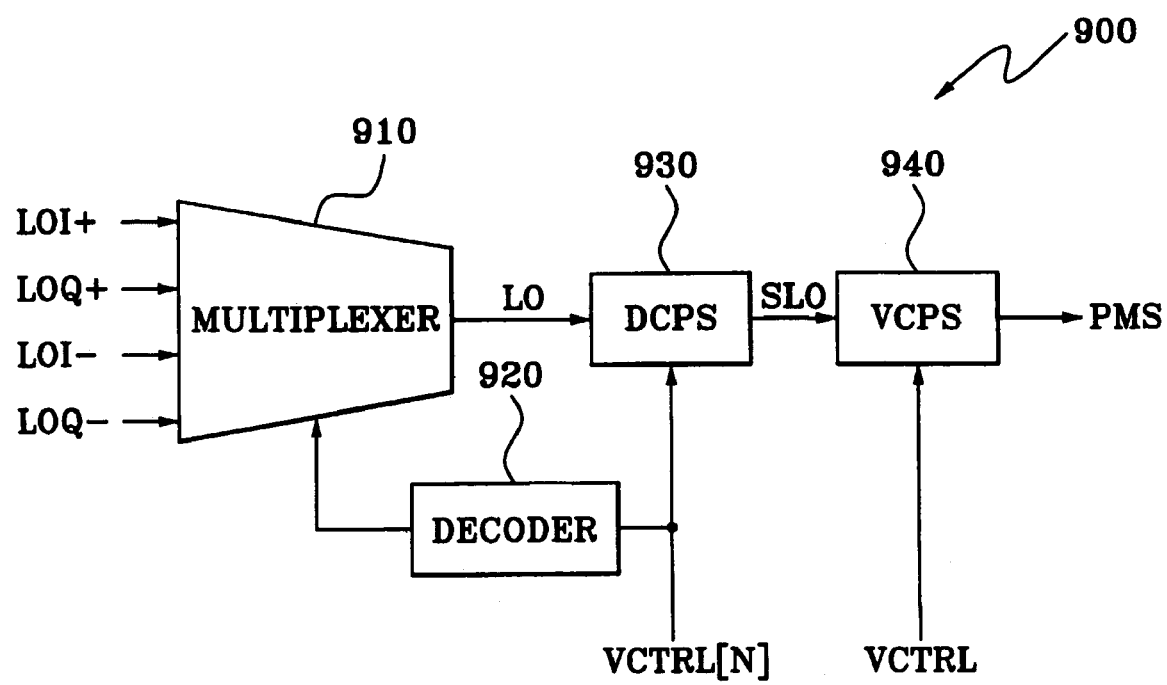
FIG. 9 is a diagram illustrating a phase modulator when utilizing quadrature signals from an oscillator according to an embodiment of the present invention.

FIG. 9 is a diagram illustrating a phase modulator 900 when utilizing multiple signals, for example, four quadrature oscillation signals LOI+, LOI−, LOQ+ and LOQ− from the VCO 312. In FIG. 9, a DCPS 930 corresponds to the DCPS 411 of FIG. 4, and the VCPS 940 corresponds to the VCPS

412 of FIG. 4. The phase modulator 900 includes a multiplexer 910 and a decoder 920.

The phase modulator 900 may modulate a phase at a higher speed by utilizing the four quadrature oscillation signals LOI+, LOI−, LOQ+ and LOQ−. The multiplexer 910 selects one of the four oscillation signals LOI+, LOI−, LOQ+ and LOQ−, each signal having a 90 degree phase difference from its adjacent signal, based on a selection signal from the decoder 920. The multiplexer 910 outputs the selected oscillation signal as a local signal, which is then inputted into the DCPS 930. The oscillation signals LOI+, LOI−, LOQ+ and LOQ− may be generated in the VCO 312. When all the oscillation signals LOI+, LOI−, LOQ+ and LOQ− can not be generated in the VCO 312, predetermined polyphase filters (PPFs) may be utilized. The decoder 920 decodes the digital input VCTRL[N] and generates the selection signal so that a signal with a phase value closest to a target phase value based on the digital input VCTRL[N] is selected from the four oscillation signals. Accordingly, the burdens required for adjusting the phase of the selected local signal in the DCPS 930 and the VCPS 940 may be reduced.

For example, if the phase of the phase-modulated signal PMS that is being currently outputted is close to the phase of signal LOI+ and if the target phase value based on the digital input VCTRL[N] should be 180 degrees phase-shifted, the decoder 920 outputs a corresponding digital value so that LOI−, having a 180 degree phase difference with respect to the signal LOI+, is selected. Accordingly, the multiplexer 910 selects the signal LOI− as the local signal LO and outputs the signal LOI− to the DCPS 930. In this case, the DCPS 930 and the VCPS 940, that is, the RF phase shifter 410 of FIG. 4, do not need to phase-shift an entire 180 degrees. The desired phase-modulated signal PMS may be generated by a small phase adjustment which is just enough to compensate for an error of the local signal that is selected in the multiplexer 910.

As described above, in the phase modulator 320 according to an embodiment of the present invention, when the RF phase shifter 410 modulates the phase of the local signal LO that is generated in the VCO 312 based on the digital input VCTRL[N]. The RF phase shifter 410 is controlled by the phase-controlled loop 430 to be phase-locked to the modulation reference signal REF that the baseband phase shifter 420 generates from the local signal and the reference clock signal RCLK based on the digital input VCTRL[N]. The phase-controlled loop 430 phase-locks using the modulation reference signal REF so that the phase-modulated signal PMS generated in the RF phase shifter 410 has a phase value based on the digital input VCTRL[N].

As described, as a phase modulator according to the present invention phase-modulates a passband signal after a VCO, the phase modulator is suitable for a high speed polar modulator for multi-band processing in various types of phase modulation schemes such as, for example, QPSK and BPSK. Accordingly, the phase modulator is applicable to a transmitter of a ubiquitous system such as, for example, a mobile phone, a DMB phone and a PDA for a high speed wireless communication and may improve system performance.

The invention can also be embodied as computer readable codes on a computer readable recording medium. The computer readable recording medium is any data storage device that can store data which can be thereafter read by a computer system. Examples of the computer readable recording medium include, but are not limited to, read-only memory (ROM), random-access memory-(RAM), CD-ROMs, magnetic tapes, floppy disks, optical data storage devices and carrier waves (such as data transmission through the Internet). The computer readable recording medium can also be distributed over network coupled computer systems so that the computer readable code is stored and executed in a distributed fashion.

Although a few exemplary embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A phase modulator comprising:
   a radio frequency (RF) phase shifter phase-shifting a local signal according to a digital input, phase-adjusting the phase-shifted signal based on a control voltage and generating a phase-modulated signal having a phase value corresponding to the digital input;
   a baseband phase shifter phase-adjusting a reference clock signal by the phase value corresponding to the digital input based on the local signal to generate a modulation reference signal; and
   a phase control loop generating the control voltage from the modulation reference signal and a feedback signal corresponding to the phase-modulated signal, the phase control loop phase-locking the phase-modulated signal to the modulation reference signal.

2. The phase modulator of claim 1, wherein the local signal is an oscillation signal phase-locked to the reference clock signal and is at a higher frequency than the reference clock signal.

3. The phase modulator of claim 1, wherein the reference clock signal is a baseband signal generated from a crystal oscillator.

4. The phase modulator of claim 1, wherein the baseband phase shifter phase-adjusts the reference clock signal by the phase value corresponding to the digital input by counting a number of pulses of a high/low logic signal corresponding to the local signal.

5. The phase modulator of claim 1, wherein the phase control loop is configured to compare a frequency-divided signal of the feedback signal and the modulation reference signal, and to generate the control voltage based on the comparison result.

6. The phase modulator of claim 1, wherein the phase control loop comprises:
   a limiter buffering the feedback signal to a high/low logic signal;
   a divider frequency-dividing an output of the limiter;
   a phase/frequency detector comparing a phase of the output of the divider and a phase of the modulation reference signal and generating a phase difference signal;
   a charge pump adjusting an amount of an output charge based on the phase difference signal; and
   a loop filter generating a voltage corresponding to the control voltage based on the output charge of the charge pump.

7. The phase modulator of claim 6, further comprising:
   a phase error detection unit detecting a phase error based on the phase difference signal and the local signal.

8. The phase modulator of claim 7, wherein the phase error detection unit comprises:
   a phase error counter counting a number of pulses of a high/low logic signal corresponding to the local signal for a phase duration corresponding to the phase difference signal; and a determination unit generating a flag signal that indicates whether the counted value is more or less than a threshold.

9. The phase modulator of claim 1, wherein the RF phase shifter comprises:
   a digitally-controlled phase shifter comprising a first set of R-C filters, each R-C filter having a resistor and at least one of a varactor array and a switched-capacitor array for each of differential signals of the local signal, the digitally-controlled shifter changing a capacitance of at least one of the varactor array and the switched-capacitor array based on the digital input and phase-shifting each of the differential signals of the local signal; and
   a voltage-controlled phase shifter comprising a second set of R-C filters, each R-C filters having a resistor and a varactor for each of the phase-shifted differential signals, the voltage-controlled phase shifter changing a capacitance of the respective varactor based on the control voltage, phase-adjusting the phase-shifted differential signals and generating differential signals of the phase-modulated signal.

10. The phase modulator of claim 1, wherein the RF phase shifter comprises:
    a digitally-controlled phase shifter comprises a capacitor and at least one of a varactor array and a switched-capacitor array respectively connected to each side of a first coil of a first transformer and a capacitor and at least one of a varactor array and a switched-capacitor array respectively connected to each side of a second coil of the first transformer, the digitally-controlled phase shifter phase-shifting the local signal by receiving the local signal via the capacitor connected to the first coil of the first transformer and changing capacitance of the at least one of the varactor array and the switched-capacitor array on each coil of the first transformer based on the digital input, and the digitally-controlled phase shifter outputting the phase-shifted signal via the capacitor connected to the second coil of the first transformer; and
    a voltage-controlled phase shifter having a capacitor and a varactor respectively connected to each side of a first coil of a second transformer and a capacitor and a varactor respectively connected to each side of a second coil of the second transformer, the voltage-controlled phase shifter phase-adjusting the phase-shifted signal and thereby generating the phase-modulated signal by receiving the phase-shifted signal from the digitally-controlled phase shifter via the capacitor connected to the first coil of the second transformer and the voltage-controlled phase shifter changing capacitance of the varactors of the second transformer based on the control voltage, and outputting the phase-modulated signal via the capacitor connected to the second coil of the second transformer.

11. The phase modulator of claim 1, further comprising:
    a multiplexer selecting one of a plurality of oscillation signals each having a phase different from the other oscillation signals, the selection based on a selection signal, and the multiplexer outputting the selected oscillation signal as the local signal; and
    a decoder decoding the digital input to generate the selection signal.

12. The phase modulator of claim 11, wherein the decoder generates the selection signal such that an oscillation signal with a phase closest to a target phase value, which is based on the digital input, is selected from the plurality of oscillation signals.

13. The phase modulator of claim 12, wherein the plurality of oscillation signals is four oscillation signals and the phase of each oscillation signal is shifted from the adjacent oscillation signals by 90 degrees.

14. The phase modulator of claim 1, wherein the phase modulator is utilized for a transmitter of a polar modulation scheme.

15. A phase modulation method comprising:
    phase-shifting a local signal according to a digital input, phase-adjusting the phase-shifted signal according to a control voltage and generating a phase-modulated signal having a phase value based on the digital input;
    phase-adjusting a reference clock signal by a phase value corresponding to the digital input based on the local signal and generating a modulation reference signal; and
    generating the control voltage from the modulation reference signal and a feedback signal corresponding to the phase-modulated signal, and phase-locking the phase-modulated signal to the modulation reference signal.

16. The method of claim 15, wherein the local signal is an oscillation signal phase-locked to the reference clock signal and is at a higher frequency than the reference clock signal.

17. The method of claim 15, wherein the reference clock signal is a baseband signal generated from a crystal oscillator.

18. The method of claim 15, further comprising:
    comparing a frequency-divided signal of the feedback signal and the modulation reference signal; and
    generating the control voltage according to the comparison result.

19. The method of claim 15, wherein the generating of the phase-modulated signal comprises:
    providing a set of first R-C filters, each R-C filter having a resistor and at least one of a varactor array and a switched-capacitor array for each of differential signals in the local signal, changing capacitance of at least one of the varactor array and the switched-capacitor array based on the digital input and phase-shifting each of the differential signals of the local signal; and
    providing a second set of R-C filters, each R-C filter having a resistor and a varactor for each of the phase-shifted differential signals, changing capacitance of the respective varactor based on the control voltage, phase-adjusting the phase-shifted differential signals and generating differential signals of the phase-modulated signal.

20. The method of claim 15, wherein the generating of the phase-modulated signal comprises:
    providing a capacitor and at least one of a varactor array and a switched-capacitor array respectively connected to each side of a first coil of a first transformer and a capacitor and at least one of a varactor array and a switched-capacitor array respectively connected to each side of a second coil of a first transformer, phase-shifting the local signal by receiving the local signal via the capacitor connected to the first coil of the first transformer, changing capacitance of the at least one of the varactor array and the switched-capacitor array on each coil of the first transformer based on the digital input, and outputting the phase-shifted signal via the capacitor connected to the second coil of the first transformer; and
    providing a capacitor and a varactor respectively connected to each side of a first coil of a second transformer and a capacitor and a varactor connected to each side of a second coil of a second transformer, phase-adjusting the phase-shifted signal and generating the phase-modulated signal by receiving the phase-shifted signal via the capacitor connected to the first coil of the second transformer and changing capacitance of the varactors of the second transformer based on the control voltage, and outputting the phase-modulated signal via the capacitor connected to the second coil of the second transformer.

21. The method of claim 15, further comprising:
decoding the digital input to generate a selection signal;
selecting one of a plurality of oscillation signals each having a phase different from the other oscillation signals based on the selection signal; and
outputting the selected oscillation signal as the local signal.

22. The method of claim 21, wherein the plurality of oscillation signals is four oscillation signals and the phase of each oscillation signal is shifted from the adjacent oscillation signals by 90 degrees.

23. The method of claim 21, wherein the selection signal is generated such that an oscillation signal with a phase closest to a target phase value based on the digital input is selected from the plurality of oscillation signals.

24. The method of claim 15, wherein the phase modulation method is utilized for a transmitter of a polar modulation system transmitter.

25. A computer readable storage medium storing a program, the program being used by a computer for execution of:
phase-shifting a local signal according to a digital input, phase-adjusting the phase-shifted signal according to a control voltage and generating a phase-modulated signal having a phase value based on the digital input;
phase-adjusting a reference clock signal by a phase value corresponding to the digital input and based on the local signal and generating a modulation reference signal; and
generating the control voltage from the modulation reference signal and a feedback signal corresponding to the phase-modulated signal, and phase-locking the phase-modulated signal to the modulation reference signal.

* * * * *